United States Patent [19]

Yamashina et al.

[11] 4,082,040
[45] Apr. 4, 1978

[54] LITHOGRAPHIC PRINTING PLATE

[75] Inventors: Toshiro Yamashina, Sappro; Hirokazu Sakaki, Yoshida, both of Japan

[73] Assignee: Fuji Photo Film Co., Ltd., Minami-ashigara, Japan

[21] Appl. No.: 710,038

[22] Filed: Jul. 30, 1976

[30] Foreign Application Priority Data

Aug. 1, 1975 Japan .................................. 50-93830

[51] Int. Cl.$^2$ .......................... B41N 1/08; G03F 7/08
[52] U.S. Cl. ........................................ 101/456; 96/33; 101/459; 204/192 C; 204/192 D
[58] Field of Search ....................... 204/192 C, 192 D; 96/33; 101/456, 459, 458

[56] References Cited

U.S. PATENT DOCUMENTS

| 3,108,900 | 10/1963 | Papp | 204/192 C |
|---|---|---|---|
| 3,461,054 | 8/1969 | Vratny | 204/192 C |
| 3,600,218 | 8/1971 | Pennebaker | 204/192 D |
| 3,679,418 | 7/1972 | Stroszynski | 101/454 |
| 3,762,325 | 10/1973 | Hallman et al. | 101/453 |

FOREIGN PATENT DOCUMENTS

| 1,201,743 | 8/1970 | United Kingdom | 204/192 C |

*Primary Examiner*—Clyde I. Coughenour
*Attorney, Agent, or Firm*—Sughrue, Rothwell, Mion, Zinn and Macpeak

[57] ABSTRACT

A lithographic printing plate comprising a support and a layer of aluminum nitride formed thereon, said layer of aluminum nitride having a thickness of from about 100 A to about 10,000 A.

5 Claims, No Drawings

LITHOGRAPHIC PRINTING PLATE

Field of the Invention

This invention relates to a lithographic printing plate, more specifically, to a lithographic printing plate consisting essentially of a support and an aluminum nitride layer formed thereon.

Description of the Prior Art

An aluminum plate has chiefly been used as a support for pre-sensitized lithographic printing plates (PS plates). Other supports used include plastics such as polyethylene or polypropylene, paper, plastic-laminated papers, or metallic plates such as zinc, copper, chromium or iron plates.

Paper or plastics used as a support for lithographic plates suffer from the defect that they are susceptible to surface injury because of their low scratch resistance, and tend to be soiled during printing because of insufficient hydrophilicity.

Aluminum is in wide use as a support for lithographic plates because of its light weight and superior dimensional stability, but has the defect of susceptibility to surface scratching. In order to remedy this defect, it is the practice to form an anodically oxidized coating on the surface of the aluminum, but its scratch resistance is still far lower than other metals such as copper or chromium.

On the other hand, multi-layered metallic plates are known as lithographic plates having good scratch resistance and good printing durability. They are not preferred, however, for environmental safety reasons because waste liquors containing materials such as copper ions or chromium ions are generated during the plate-making process involving such materials.

SUMMARY OF THE INVENTION

Accordingly, it is one object of this invention to provide a lithographic printing plate which has scratch resistance during printing.

Another object of this invention is to provide a lithographic printing plate which does not pose environmental pollution problems, and has good durability to printing.

As a result of extensive investigations, we have found that the above objects can be achieved by providing a layer of aluminum nitride on support.

DETAILED DESCRIPTION OF THE INVENTION

The aluminium nitride layer in accordance with this invention is formed on the support by RF (Radio Frequency) reactive sputtering which comprises ionizing an inert gas containing a reactive gas such as nitrogen by a glow discharge at high voltage in a high vacuum vessel, and allowing the ionized gas to an aluminum target to cause the aluminum nitride to sputter out and thus to deposit it on the desired support.

When the scratch resistance of aluminum is taken as 1, a surface of aluminum having an aluminum nitride layer formed thereon has about a 5 to 10 times as great a scratch resistance as the aluminum. This scratch resistance is superior to that of aluminum having an anodically oxidized coating formed thereon which is about 3 to 5 times as great as that of aluminum alone.

The sputtering conditions utilized to form the aluminum nitride layer in accordance with the present invention can be relatively freely selected. For example, sputterring is typically performed in an inert gas such as nitrogen, $NH_3$ argon, helium, xenon, or the like, particularly preferably argon, nitrogen $NH_3$ or helium considering the price thereof (nitrogen or $NH_3$ can function as an inert gas). The system preferably comprises from about 10 to 100%, even more preferably 40 to 100% nitrogen $NH_3$, the balance of the system being an inert gas other than nitrogen when the system is not 100% nitrogen or $NH_3$.

The sputtering is a radio frequency reactive sputtering (hereafter merely RF sputtering) using a voltage of about 2 to about 3 KV and an electric current of about 200 to about 300 mA, though this voltage and electric current are not limitative. Since such is easily commercially commercially available, RF sputtering usually involves a frequency of 13.56 MHz, though one skilled in the art will appreciate this frequency is not limitative in any fashion.

It is convenient to practice RF sputtering at a total pressure of about $1 \times 10^{-3}$ to about $5 \times 10^{-2}$ Torr, even more preferably $5 \times 10^{-3}$ to $3 \times 10^{-2}$ Torr, with the inert gas (if present) and the reactive gas such as $N_2$, $NH_3$ and the like being present in a high vacuum vessel.

RF sputtering is typically conducted at room temperature, but, as one skilled in the art will appreciate, the temperature is very high in the surface at the target (on the order of 1000° K) and the temperature of the surface of the aluminum nitride layer is close to room temperature.

Best process efficiency is obtained using a deposition rate of about 50 A/min. to about 200 A/min., e.g., if one wishes to prepare a layer on the order of 100 A to 10,000 A thick, typically used in accordance with the present invention, about 30 seconds to about 3 hours and 20 minutes will be utilized for the sputtering procedure.

Very useful sputtering conditions are disclosed in Tetsuya Abe and Toshiro Yamashita "Thin Solid Films" Vol. 30 pp. 19–27 (1975) (Lausanne).

The support utilized in accordance with the present invention is typically a flat, thin plate. Since the aluminum nitrite layer is formed by sputtering, the support is typically a metal or a metal having a ceramic coated thereon, and such are preferred, though not mandatory. Most preferred examples of supports used in the present invention include metal plates such as aluminum, iron, magnesium, zinc, tin, copper, chromium, alloys such as brass, nickel, titanium, etc., laminates of various metals such as iron plated with zinc, stainless steel plated with copper, metals having coated thereon a ceramic such as an iron plate having a porcelain enamel coated thereon, and the like. Hereafter aluminum is often exemplified.

The thickness of the aluminum nitride layer on the aluminum, which differs according to the conditions for forming the same, is preferably about 100 to about 10,000 A, as earlier indicated, even more preferably from 500 A to 3,000 A.

The thickness of the support utilized is not, of course, limited in any particular fashion so long as the support provides a sufficient strength for easy handling, and most preferred supports are metallic supports having a melting point greater than 230° C.

Before providing a light-sensitive layer on the support having aluminum nitride layer formed thereon, the surface of the aluminum nitride layer may be treated by a hydrophilizing treatment as ordinarily performed by those skilled in the art (e.g., the sodium silicate treatment as disclosed in U.S. Pat. No. 2,714,066, or the electro-deposition of silicates as described U.S. Pat. No. 3,658,662).

The light-sensitive layer is conventional and can be one containing, for example, a positive-type light-sensitive diazo compound such as a polymer containing an o-quionone diazide (for example, as described in Japanese Pat. Publication 28403/68), a negative-type light-sensitive diazo compound such as a p-diazodiphenyl amine compound (as described in U.S. Pat. No. 2,714,066), a light-sensitive unsaturated polyester compound (as described in U.S. Pat. No. 3,030,208), a combination of a light-sensitive azide compound and a water-soluble polymeric compound (e.g., polyvinyl pyrrolidone or casein as disclosed in German Pat. No. 1,447,099), a light-sensitive silver halide emulsion as is conventionally used in the art, for example, a light-sensitive silver halide emulsion as is disclosed in U.S. Pat. No. 3,146,104, or a combination of a bichromate salt such as a sodium or potassium salt, and a water-soluble polymeric compound (e.g., polyvinyl alcohol, casein, or gelatin or polyacrylamide). The thickness of the light-sensitive layer is not unduly limited, but good product characteristics are obtained when the thickness is about 0.02 to about 5 $\mu$.

Due to the good stability of the support having an aluminum nitride layer formed in accordance with the present invention, the drying conditions for the light-sensitive layer prior to use are not important, and are merely selected from those conventionally used in the art.

The printing plate master so produced is image-wise exposed, developed in the same way as in the preparation of conventional PS plates as disclosed in U.S. Pat. No. 2,714,066 and then immediately mounted on a printing press, followed by printing.

The lithographic plate so obtained shows good printing durability which is equivalent to, or greater than, conventional printing plates.

The excellent advantage of this invention is to increase the scratch resistance of the surface of the support. When the aluminum nitride layer is formed on a non-metallic surface such as paper or plastic, non-image areas of the surface have resistance to soiling during printing. Further, the aluminum nitride layer-provided surface becomes gray to prevent halation.

The following Examples illustrate the invention more specifically.

EXAMPLE I

A 0.24 mm-thick aluminum sheet (Aluminum Alloy No. 2S 0.4 Si; 0.6 Mg; 99.0 Al, % by wt.) was brushed to abrade the same, and then placed in a high vacuum vessel. An aluminum nitride layer was formed on its surface by sputtering. The sputtering conditions were as follows: The target used was 99.98% Al 3mm thick, and argon gas was used as the inert gas. The distance between the aluminum sheet and the target was 7 cm. The partial pressures of argon and nitrogen were 1.7 × 10$^{-2}$ Torr, and 8 × 10$^{-3}$ Torr, respectively. The vessel was first evacuated to 5 × 10$^{-7}$ Torr, whereafter the nitrogen gas and argon gas were introduced to provide the desired partial pressures. Thereafter, RF sputtering was initiated at 2.3 KV, 270–280 mA and 13.56 MHz at room temperature. A uniform coating of aluminum nitride of a thickness of about 1,000A was formed on the surface of the aluminum sheet.

The aluminum nitride surface was immersed for 2 min. in a bath of a 2% by weight aqueous solution of sodium silicate (SiO$_2$/Na$_2$O = 3/1 molar ratio) heated at 80° C, washed with water and then dried at 100° C for 1 minute. A light-sensitive layer of the following formulation was then coated on the surface so that the amount of the coating was 2.0 g/m$^2$ (dry basis) and then dried at 100° C for 2 minutes.

| Formulation of the light-sensitive layer | |
|---|---|
| A diazo compound (prepared by condensing p-diazodiphenylamine with p-toluenesulfonic acid and formaldehyde; see U.S. Pat. No. 2,714,066, Column 7 for detailed production conditions) | 3 parts by weight |
| Shellac | 20 parts by weight |
| Dimethyl formamide | 80 parts by weight |

The resulting negative-type light-sensitive lithographic printing plate was exposed for 30 sec. through a transparent negative to a PS light (made by Fuji Photo Film Co., Toshiba Metal Halide Lamp 3 KW, located 1 meter away from the plate. The exposed plate was immersed for about 1 min. at room temperature (about 25° C) in a 20% by weight aqueous solution of isopropyl alcohol to develop the plate. The resulting plate was mounted on a printing press (Rota-print R 40/K 30), and printing performed. More than 100,000 copies of good quality were obtained.

EXAMPLE 2

A 0.3 mm-thick aluminum sheet (Aluminum Alloy No. 3S 1.2 Mn; 98.8 Al, % by wt.) was brushed to abrade the same, and subjected to sputtering in a high vacuum vessel under the same conditions as in Example 1 to form an aluminum nitride layer having a thickness of about 1000 A. The surface was then immersed for 2 min. in a bath of a 2% by weight aqueous solution of sodium silicate (SiO$_2$/Na$_2$O = 3/1 molar ratio) heated at 80° C, washed with water, and dried at 100° C for 1 minute. A light-sensitive layer of the following formulation was coated on the surface so that the amount became 2.5 g/m$^2$ (dry basis) and dried at 100° C for 2 minutes.

| Formulation of the light-sensitive layer | |
|---|---|
| Naphthoquinone-(1,2)-diazide(2)-5-sulfonic acid ester of polyoxyphenol obtained by condensation of acetone and pyrogallol | 2 parts by weight (see U.S. Pat. No. 3,635,709 for detailed production conditions) |
| Novolak-type cresol-formaldehyde resin (Hitanol #1030 produced by Hitachi Kasei Kogyo Co., Ltd.) | 4 parts by weight |

The resulting positive-type light-sensitive lithographic printing plate was exposed for 30 sec. through a transparent positive to a PS light (made by Fuji Photo Film Co., Ltd., Toshiba Metal Halide Lamp 3 KW) located 1 meter away from the plate, and then immersed for 1 min. at room temperature (about 25° C) in a 7% by weight aqueous solution of sodium silicate (SiO$_2$/Na$_2$O = 3/1 molar ratio) to develop the plate. The resulting lithographic plate was mounted on a Roland printing press, and printing performed. More than 70,000 copies of good quality were obtained.

While the invention has been described in detailed and with reference to specific embodiments thereof, it will be apparent to one skilled in the art that various changes and modification can be made therein without departing from the spirit and scope thereof.

What we claim is:

1. A lithographic printing plate comprising a flat, thin support, a layer of aluminum nitride formed thereon by radio frequency reactive sputtering and a light-sensitive layer over said aluminum nitride layer, said layer of aluminum nitride having a thickness of from about 100 A to about 10,000A, and said aluminum nitride surface coated or converted by a hydrophilizing treatment piror to the coating of said light-sensitive layer.

2. The lithographic printing plate of claim 1 wherein said support is aluminum.

3. The lithographic printing plate of claim 1 wherein said light-sensitive layer contains a positive-type light-sensitive diazo compound, a negative-type light-sensitive diazo compound, a light-sensitive unsaturated polyester compound, a combination of a light-sensitive azide compound and a water-soluble polymeric compound, a light-sensitive silver halide emulsion or a combination of a bichromate salt and a water-soluble polymeric compound.

4. The lithographic printing plate of claim 3 wherein said positive-type light-sensitive diazo compound is a polymer containing an o-quinone diazide, said negative-type light-sensitive diazo compound is p-diazodiphenyl amine compound, said water-soluble polymeric compound used in combination with said light-sensitive azide compound is polyvinyl pyrrolidone or casein, said bichromate salt is a sodium or potassium salt and said water-soluble polymeric compound used with said bichromate salt is polyvinyl alcohol, casein, gelatin or polyacrylamide.

5. The lithographic printing plate of claim 3 wherein the thickness of the light-sensitive layer is about 0.02 to about 5 microns.

* * * * *